US006188175B1

(12) United States Patent
May et al.

(10) Patent No.: US 6,188,175 B1
(45) Date of Patent: *Feb. 13, 2001

(54) ELECTROLUMINESCENT DEVICE

(75) Inventors: Paul May; Karl Pichler, both of Cambridge (GB)

(73) Assignee: Cambridge Display Technology Limited, Cambridge (GB)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/922,809

(22) PCT Filed: Apr. 17, 1996

(86) PCT No.: PCT/GB96/00925

§ 371 Date: Aug. 2, 1997

§ 102(e) Date: Aug. 2, 1997

(87) PCT Pub. No.: WO96/33594

PCT Pub. Date: Oct. 24, 1996

(30) Foreign Application Priority Data

Apr. 18, 1995 (GB) .................................................. 9507860
Sep. 19, 1995 (GB) .................................................. 9519170

(51) Int. Cl.[7] ............................... H01J 1/62; H01L 35/24

(52) U.S. Cl. .......................... 313/504; 313/506; 313/503; 257/40

(58) Field of Search .................................... 313/502, 503, 313/504, 506, 500, 501; 257/40

(56) References Cited

U.S. PATENT DOCUMENTS 4,877,995 10/1989 Thioulouse et al. ................. 313/507
5,445,899 * 8/1995 Budzilek .............................. 313/506
5,518,824 * 5/1996 Funhoff et al. ...................... 313/506
5,670,791 * 9/1997 Halls et al. ........................... 257/40
5,707,745 1/1998 Forrest et al. ....................... 428/432
5,721,160 2/1998 Forrest et al. ......................... 438/28
5,757,026 5/1998 Forrest et al. ......................... 257/40

FOREIGN PATENT DOCUMENTS

WO96/
0389829 8/1990 (EP) ............................. H05B/33/14
05013170 1/1993 (JP) .............................. H05B/33/14

* cited by examiner

*Primary Examiner*—Vip Patel
*Assistant Examiner*—Joseph Williams
(74) *Attorney, Agent, or Firm*—Merchant & Gould P.C.

(57) ABSTRACT

An electroluminescent device is described which utilizes a "memory effect" which allows a device to be turned on by a turn on voltage and then for the voltage to be reduced without a reduction in the light output. The present electroluminescent device incorporates a semiconductive conjugated polymer layer together with a light dependent voltage regulating layer the conductivity of which varies with light incident thereon from the semiconductive conjugated polymer layer. An electroluminescent device using a semiconductive conjugated polymer layer is relatively simple to manufacture as compared with earlier devices.

15 Claims, 3 Drawing Sheets

ELECTROLUMINESCENT DEVICE

FIELD OF THE INVENTION RECEIVED

This invention relates to electroluminescent devices.

BACKGROUND OF THE INVENTION

The most popular flat panel display technology currently in use is based on liquid crystal devices, which are effectively light shutters used in combination with illumination sources. In graphic displays there are many different pixels that must be independently driven. Typically this is achieved through matrix addressing, where each pixel is addressed by application of a suitable switching voltage applied between row and column conducting tracks on either side of the liquid crystal. Each row is selected by applying a voltage to the row track, and individual pixels within the row are selected by application of column data voltages to the column tracks. The rows are addressed sequentially, each for a line address time such that the whole frame is addressed within the frame time. However, because the speed of switching of the liquid crystals is slow relative to the line addressing time, when video frame rates are required (<20 ms), special circuitry has to be added to each pixel. This arrangement is called active matrix addressing and often involves the use of thin-film transistors at each pixel. Because of the increased complexity of the active matrix displays they are much more expensive to make than passive matrix devices.

Electroluminescent devices are made from a layer of a suitable material between two conductive electrodes. The material emits light when a suitable voltage is applied across the electrodes. One class of such materials is semiconductive conjugated polymers which have been described in our earlier Patent U.S. Pat. No. 5,247,190, the contents of which are herein incorporated by reference. The electrodes can be patterned to form a matrix of rows and columns so that matrix addressing can take place. There are several potential advantages over liquid crystal graphic displays. Because the polymers are directly emissive, no backlight is required. Also polymers of different colours can be fabricated so that a suitably patterned matrix of polymers can be used for a colour display without the use of colour filters as required by a liquid crystal display. Perhaps most significantly, the light emitting polymers are very fast, easily achieving switching times of 1 microsecond, and therefore they are able to react directly when a particular row is selected. Unfortunately, when the row voltage is removed they immediately switch off. To achieve a given average brightness for the display as a whole, each individual line needs to be driven at a peak brightness that is higher by a factor L, where L is the number of lines. The peak brightness that a given emitting area can achieve is limited by the amount of current that can be injected into the semiconductor due to space charge effects.

So-called thin film inorganic electroluminescent devices are also known, as described for example by M. J. Russ and D. I. Kennedy in the Journal of the Electrochemical Society, vol. 114 (1967) page 1066, whose contents are herein incorporated by reference. These too can suffer from the same problem. Phosphor materials are sandwiched between dielectric layers and conducting electrodes, and high ac fields are applied across the structure. When used in displays with a matrix addressing scheme, the average luminance of the display decreases with the number of lines due to a limitation in current densities. One way that this problem has been tackled is by the use of a photoconductor layer integrated with the device (e.g. an amorphous silicon layer deposited between one of the electrodes and the normally adjoining dielectric layer) as described by P. Thioulouse and I. Solomon in IEEE Transactions on Electron Devices, vol. ED-33, (1986), page 1149. The photoconductor layer provides a "memory effect" which allows a device to be turned on and driven with a given light output; subsequently the voltage can be reduced without a reduction in light output, but with the new voltage still below the original turn-on threshold voltage.

SUMMARY OF THE INVENTION

To manufacture an electroluminescent device using the thin film technology discussed above in relation to the prior art is relatively costly because of the high cost of depositing the phosphor layers and the amorphous silicon photoconductor layers. An electroluminescent device using a semiconductive conjugated polymer is much easier to manufacture.

According to one aspect of the present invention there is provided an electroluminescent device comprising first and second electrodes and, arranged between said first and second electrodes, a first layer of a semiconductive conjugated polymer acting as an electroluminescent layer and a second layer of a semiconductive conjugated polymer acting as a light dependent voltage regulating layer the conductivity of which varies with light incident thereon from the electroluminescent layer, wherein the bandgaps of the semiconductive conjugated polymers constituting the first and second layers are selected to be close to one another but with offset energy levels.

Moreover, by selecting the bandgaps of the semiconductive conjugated polymers to be as close as possible, the sensitivity of the device is maximised. Furthermore, because the energy levels of the first and second layers are offset, charge carriers of a given type will accumulate at the interface between the polymers. In this way, recombination of charge carriers in the electroluminescent layer is maximised, with the second layer acting as a charge transport layer from the associated one of the first and second electrodes to the electroluminescent layer.

The light dependent voltage regulating layer acts to regulate the voltage across the electroluminescent layer in accordance with the amount of light falling on it. For a given potential difference between the first and second electrodes, initially most of the potential difference will fall across the light dependent voltage regulating layer as a result of its low conductivity. However, as light emitted from the electroluminescent layer falls on the light dependent voltage regulating layer, the conductivity of the light dependent voltage regulating layer increases thus reducing the voltage across it and also introducing more charge carriers into the electroluminescent layer. Therefore, light emitted from the electroluminescent layer rapidly increases.

Preferably the semiconductive conjugated polymers are selected from the family of polyphenylenevinylene (PPV) and its derivatives. In one example, the first polymer is PPV and the second polymer is blue-shifted PPV (or dimethoxy PPV).

More than two semiconductive conjugated polymer layers could be used. In such as case, it would be possible to arrange for light emission from the semiconductive conjugated polymer having the second largest bandgap, while the semiconductive conjugated polymer with the lowest bandgap would constitute the photoconductive layer. The extra layer acts as a charge transport layer.

In the described embodiment, the first electrode comprises a plurality of electrode strips extending column-wise of the device and the second electrode comprises a plurality of electrode strips extending row-wise of the device, pixels being defined in the device where the row-wise extending strips and the column-wise extending strips respectively overlap.

For use of the electroluminescent device in an addressing scheme, it can comprise addressing means for applying row select voltages to the row-wise extending electrode strips and column data voltages to the column-wise extending electrode strips thereby to selectively address pixels of the display.

Advantageously, these addressing means are operable to apply dc voltages. The prior art discussed above using phosphors requires an ac voltage. Moreover, the thickness of the layers in the prior art is relatively great and therefore to achieve sufficient fields, high voltages (for example of the order of 100 V) are required. An electroluminescent device constructed in accordance with the present invention can work on low voltage dc, allowing direct drive from battery sources.

According to another aspect of the invention there is provided an electroluminescent device comprising: a first electrode associated with an electroluminescent layer; a second electrode associated with a photoconductive layer; and a third electrode located between the electroluminescent layer and the photoconductive layer.

In one embodiment there is a single third electrode. In another embodiment there are third and fourth electrodes located between the electroluminescent layer and the photoconductive layer, the third electrode defining with the first electrode an electroluminescent unit and the fourth electrode defining with the second electrode a photoconductive unit. This allows individual optimisation of the electroluminescent unit and the photoconductive unit.

In this aspect of the invention, semiconductive conjugated polymers can be used for the electroluminescent layer and the photoconductive layer. Alternatively, organic molecular films such as described in C. W. Tang, S. A. Van Slyke and C. H. Chen, Journal of Applied Physics 65, 3610 (1989) can be used.

BRIEF DESCRIPTION OF THE DRAWINGS

For a better understanding of the present invention and to show how the same may be carried into effect reference will now be made by way of example to the accompanying drawings.

DESCRIPTION OF THE PREFERRED EMBODIMENT

Figure 1A:
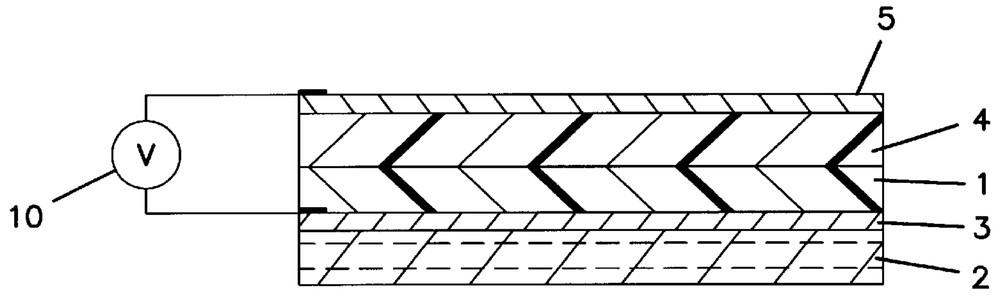
FIG. 1*a* is a section through one embodiment of the present invention.

FIG. 1*a* illustrates one embodiment of the invention. A first polymer layer 1 is deposited on a transparent substrate 2 coated with a transparent electrode 3 of indium tin oxide. A second polymer layer 4 is deposited on top of the first polymer layer 1. Finally a top metal electrode 5 is deposited on top of the second polymer layer 4. The first polymer layer 1 is a light emitting layer and the second polymer layer 4 is a photoconductive layer. The photoconductive layer 4 is designed to have a large resistance in the absence of visible light of a given wavelength or range of wavelengths. A voltage source 10 applies a voltage between the electrodes 3,5. For a given voltage across the layers, and in the absence of light, the current passing through the layers is small. Therefore the emission from the electroluminescent layer 1, which depends on the recombination of charge carriers injected from both electrodes, is small. However, when light of the appropriate wavelength or range of wavelengths is incident on the photoconductive layer the conduction of the layer increases and therefore the amount of current carried by the photoconductive layer 4 increases. Also, the proportion of the voltage dropped across the photoconductive layer decreases, increasing the field across the electroluminescent layer 1. Thus, emission increases.

As the voltage is initially increased, the device starts to turn on above a first threshold voltage $V_t''$. The device turn-on rate above the threshold is very rapid due to the effects previously described. After turn-on the emission can be limited at a maximum voltage $V_{max}$ by current-limiting space charge effects.

Figure 1B:
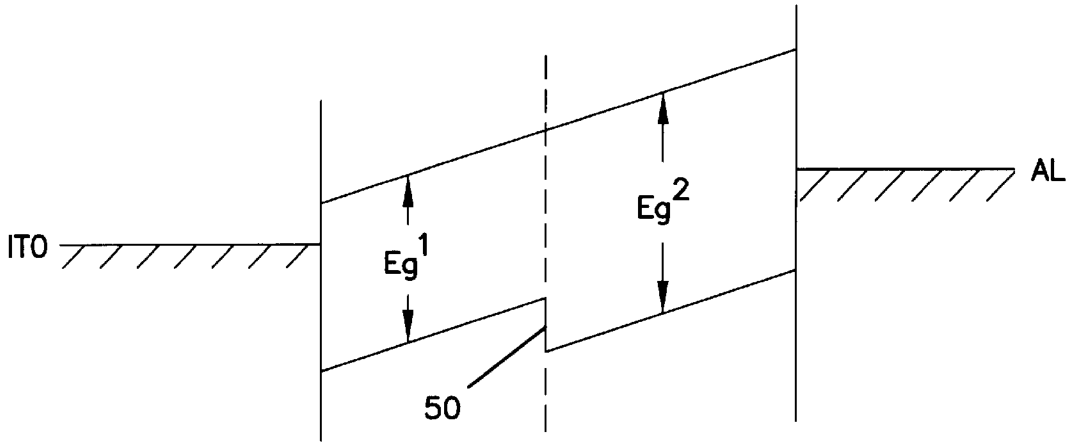
FIG. 1*b* is an energy diagram for the construction of FIG. 1*a;*

In the embodiment of FIG. 1, the electroluminescent layer 1 is a hole transporting layer and electron-hole recombination layer, and the photoconductive layer is an electron transporting layer (when photoactivated). For best efficiency of emission the number of injected electrons into the photoconductive layer 4 should be similar to the number of injected holes into the electroluminescent layer 1. Furthermore, the bandgap of the photoconductor layer is higher than that of the electroluminescent layer. This can be seen more clearly from FIG. 1*b* where $Eg^1$ represents the bandgap of the light emitting layer 1 and $Eg^2$ represents the bandgap of the photoconductive layer 4. In the embodiment illustrated by the energy diagram of FIG. 1*b*, the upper energy levels of the bandgaps of the respective polymers are aligned. However, the lower energy levels are offset. This has the effect that holes from the indium tin oxide electrode 3 become trapped at the interface 50 between the polymer layers. Electrons from the aluminium electrode 5 are transported by the photoconductive layer 4 to the interface 50. With this arrangement, recombination of charge carriers in the light emitting layer 1 is higher than in the photoconductive layer 4. However, sensitivity of the device is optimised by arranging for the bandgaps $Eg^1$ and $Eg^2$ to be relatively close to each other, despite having an offset energy level. As an example, the electroluminescent layer 1 can be formed of PPV while the photoconductive layer 4 can be formed of blue-shifted PPV. A suitable blue-shifted PPV is dimethoxy PPV as described in our Patent Application W092/03490, the contents of which are herein incorporated by reference.

Figure 1C:
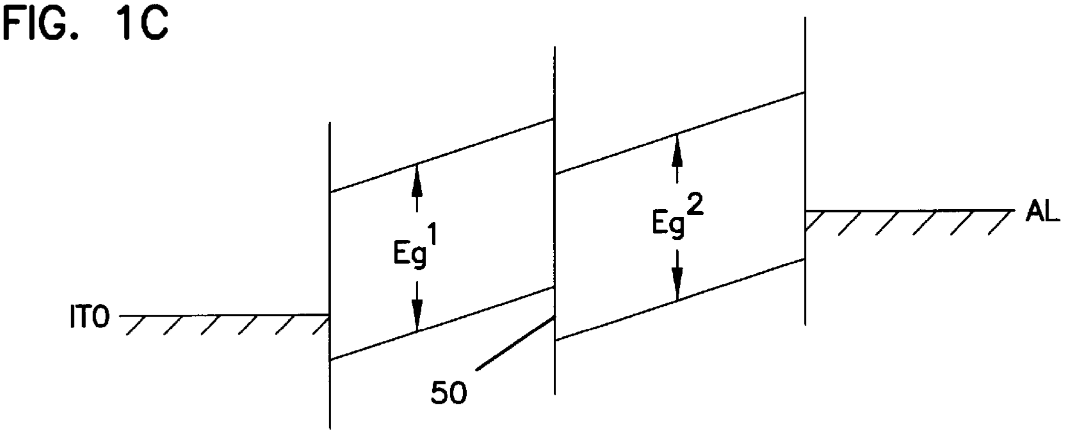
FIG. 1*c* is an energy diagram for an alternative construction of the embodiment of FIG. 1*a;*

An alternative energy level diagram for the construction of FIG. 1*a* is shown in FIG. 1*c*. In FIG. 1*c*, the bandgap of the electroluminescent layer 1, $Eg^1$, is still less than the bandgap $Eg^2$ of the photoconductive layer 4. However, both the upper and lower energy levels of the bandgaps are offset. This assists in not only the accumulation of holes from the indium tin oxide 3 at the interface 50, but also of electrons from the aluminium electrode 5.

In the embodiment of FIG. 1*b*, it can be seen therefore that the photoconductive layer also acts in part as a charge transport layer.

Figure 2A:
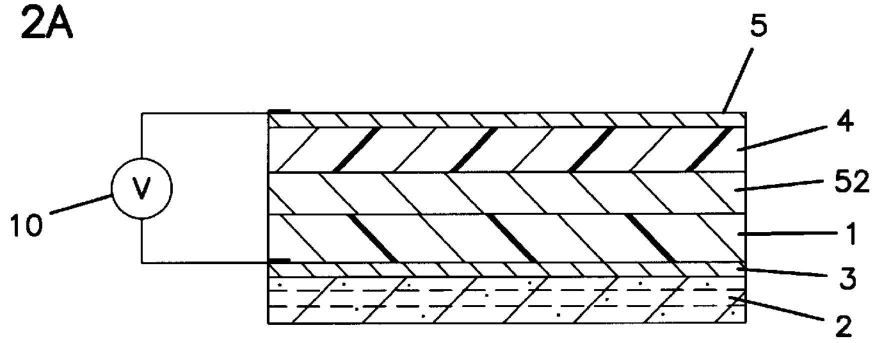
FIG. 2*a* is a section through a second embodiment of the present invention.

FIG. 2*a* illustrates a second embodiment in which an additional charge transport layer is provided. In FIG. 2*a* like numerals denote like parts as in FIG. 1*a*. Between the light emitting layer 1 and photoconductive layer 4, a third, charge transport layer 52 is provided, also of a semiconductive conjugated polymer. In one example, the light emitting layer 1 is PPV, the charge transport layer 52 is blue-shifted PPV and the photoconductive layer 4 is red-shifted PPV (for example cyano PPV).

Figure 2B:
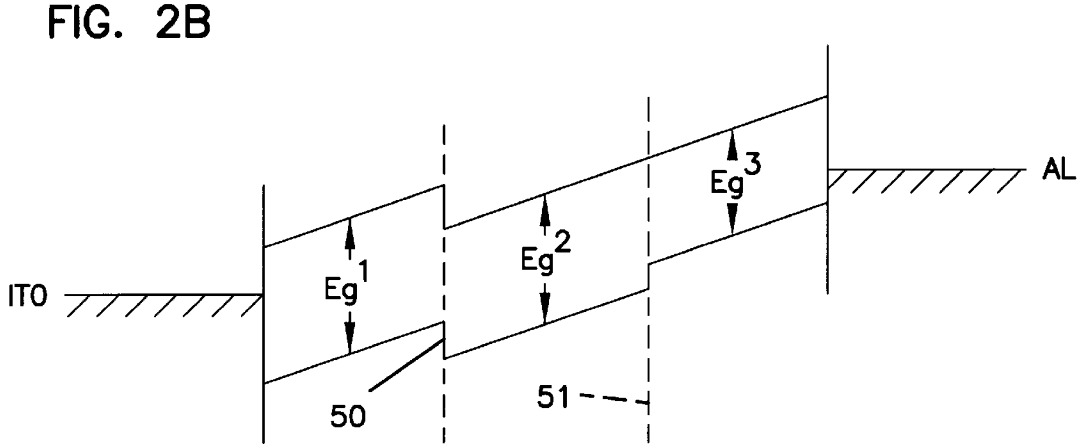
FIG. 2*b* is an energy diagram for the construction of FIG. 2*a;*

FIG. 2*b* is an energy level diagram for the construction of FIG. 2*a*. The bandgap $Eg^1$ of the light emitting layer 1 is less than the bandgap $Eg^2$ of the charge transport layer 52. The bandgap $Eg^3$ of the photoconductive layer 4 is less than the bandgap $Eg^1$ and the bandgap $Eg^2$. The upper energy levels of the bandgaps $Eg^2$ and $Eg^3$ are aligned, but offset from the upper energy level of the bandgap $Eg^1$. The lower energy level of the bandgaps $Eg^1$, $Eg^2$ and $Eg^3$ are not aligned, but are each slightly offset. The offset between the bandgap $Eg^1$ and $Eg^2$ of the upper and lower energy levels is similar to that described above with reference to FIG. 1*c*. That is, the offsets are to encourage accumulation of electrons and holes at the interface 50. Electrons are transported from the aluminium electrode 5 to the electroluminescent layer 1 through the photoconductive layer 4 and the charge transport layer 52.

In an alternative embodiment, the photoconductive layer 4 can be a hole transporting layer while the electroluminescent layer 1 is arranged adjacent to the electron injecting electrode. In either case, the photoconductive layer 4 always acts as a charge carrier transport layer. For maximum sensitivity, the bandgaps of the semiconductive conjugated polymer materials selected for the photoconductive layer and the electroluminescent layer should be as close as possible to ensure that there is good absorption by the photoconductive layer 4 of light emitted by the electroluminescent layer 1. As can be seen, for maximum emission efficiency, the energy levels of the photoconductive layer 4 and electroluminescent layer 1 are offset to allow electron/hole accumulation at the interface between the layers. As described above, in the case where the photoconductive layer 4 is an electron transporting layer, it should have the higher bandgap. However, where it acts as a hole transporting layer, it should have a lower bandgap than the electroluminescent layer 1.

Figure 3:
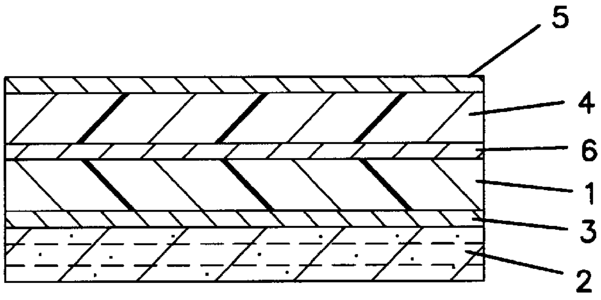
FIG. 3 is a section through a third embodiment of the present invention.

A different embodiment of the invention is shown in FIG. 3, In this embodiment, the electroluminescent layer 1 is deposited on a transparent electrode 3 such as indium tin oxide. An intermediate electrode 6 is deposited followed by the photoconductive layer 4 and a top electrode 5. A voltage is applied between electrodes 3 and 5 by a voltage source as in FIG. 1*a*, and the intermediate electrode 6 is allowed to float. In the absence of the appropriate wavelength or range of wavelengths of light that are absorbed by the photoconductor, the resistance and therefore the voltage drop across the photoconductor layer 4 is large. The voltage across the electroluminescent layer 1 is small. When light is absorbed by the photoconductor layer 4, the voltage drop across this layer is reduced, and the voltage across the electroluminescent layer is increased, with a resulting increase in the emission. To improve the coupling between the electroluminescent layer and the photoconductor layer, the middle electrode should be transparent, or if opaque, it should be patterned to transmit the maximum amount of light, while remaining electrically continuous.

Figure 4:
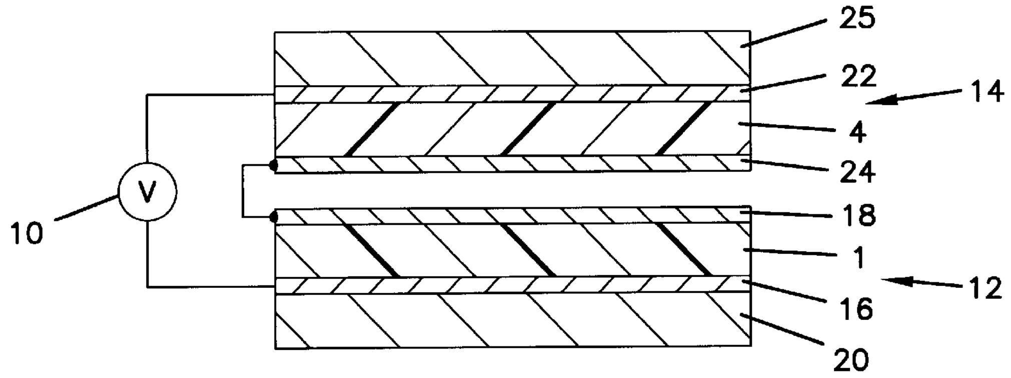
FIG. 4 is a section through a fourth embodiment of the present invention.

In another embodiment shown in FIG. 4, there are physically separated an electroluminescent unit 12 and a photoconductor unit 14. The electroluminescent unit is fabricated by depositing an electroluminescent layer 1 between two appropriate electrodes 16,18 with one electrode 16 sufficiently transparent, e.g. indium tin oxide, to act as the output face of the device. That electrode 16 is formed as a coating on a glass substrate 20. The photoconductor unit is made by depositing the photoconductor layer 4 between two appropriate electrodes 22,24, e.g. indium tin oxide and aluminium respectively. The indium tin oxide is applied as a coating to a second glass substrate 24. The two devices are brought in close proximity to each other, such that light from the electroluminescent layer 1 can be absorbed by the photoconductor layer 4. The two electrodes 18,24 that separate the electroluminescent layer 1 from the photoconductor layer 4 are sufficiently transparent, or patterned to provide optical coupling between the two layers. These two electrodes are electrically connected and a voltage is applied across the two outermost electrodes 16,22 by a voltage source 20.

By separating the photoconductive layer from the electroluminescent layer, the photoconductive unit and electroluminescent unit can be separately optimised for maximum efficiency, without having to satisfy material criteria as discussed above in relation to FIG. 1*a*.

Therefore, although the construction of FIG. 3 is more complex to manufacture than the construction of FIG. 1*a*, a more efficient structure can be produced. In the embodiments of FIGS. 3 and 4, any suitable material can be used for the electroluminescent layer and for the photoconductive layer. However, it is particularly advantageous if semiconductive conjugated polymers are used for the electroluminescent layer and for the photoconductive layer.

Furthermore, as with the embodiment of FIG. 1*a*, the electroluminescent device can comprise more than one layer, and for example can include one or more charge carrier transport layers.

Figure 5A:
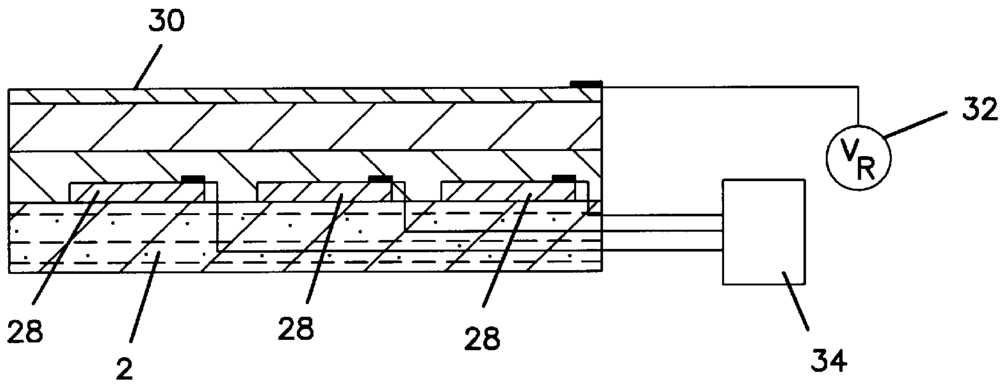
FIGS. 5*a* and 5*b* are a sectional view and plan view respectively of an electroluminescent display.
Figure 5B:
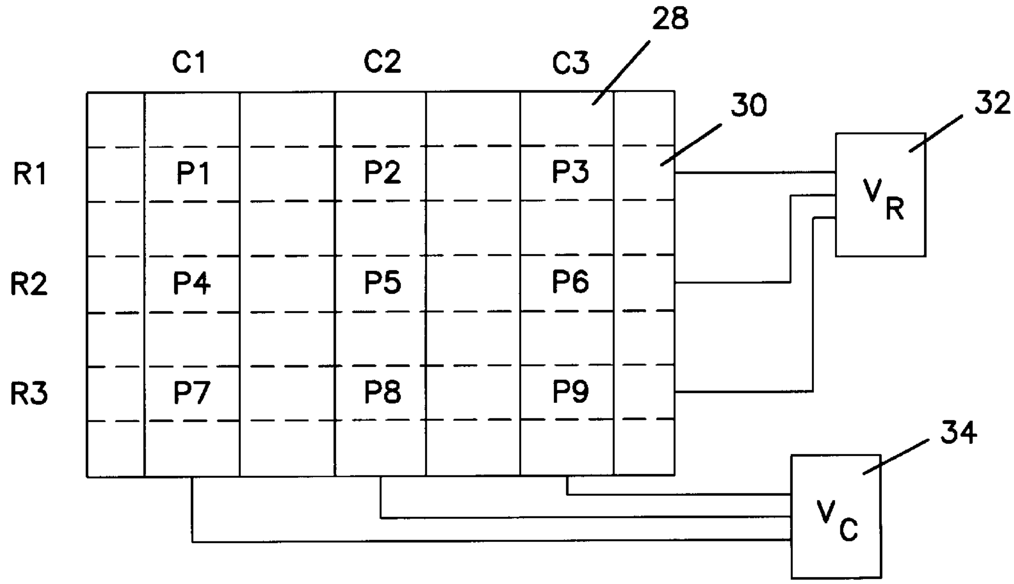

Reference will now be made to FIGS. 5*a* and 5*b* to describe how a pixelated electroluminescent device can be constructed and addressed. The following description is given in relation to the structure of FIG. 1*a*, but it will readily be appreciated that the technique can be adapted for the FIG. 5*a* is a section through an electroluminescent device in which the glass substrate 2 carries a plurality of indium tin oxide strips serving as respective column electrodes 28. Thus, the column electrodes take the place of the electrodes 3 in FIG. 1*a*. The aluminium electrode 5 is similar replaced by a plurality of aluminium strips 30 extending perpendicular to the column electrodes 28 and constituting row electrodes. This is shown more clearly in FIG. 5*b*.

Pixels P are defined by the crossover of a row and column electrode. For addressing the device, each row is sequentially selected by application of a suitable row voltage from a voltage source 32, and individual pixels in a particular row are addressed by application of a suitable column voltage from a voltage source 34. The voltage across each pixel (the difference between the applied row voltage and column voltage at that pixel) determines the light output at each pixel.

We claim:

1. An electroluminescent device comprising:

first and second electrodes; and, arranged between said first and second electrodes, a first layer of a semiconductive conjugated polymer acting as an electroluminescent layer and a second layer of a semiconductive conjugated polymer acting as a light dependent voltage regulating layer a conductivity of which varies with light incident thereon from the electroluminescent layer, wherein bandgaps of the semiconductive conjugated polymers constituting the first and second layers are selected to be close to one another but with offset energy levels.

2. An electroluminescent device according to claim 1 wherein the semiconductive conjugated polymers are selected from the family of polyphenylenevinylene (PPV) and its derivatives.

3. An electroluminescent device according to claim 1 which includes a third layer between the first layer and the second layer, said third layer comprising a semiconductive conjugated polymer and acting as a transport layer for charge carriers.

4. An electroluminescent device according to claim 1 wherein the first electrode comprises a plurality of electrode strips extending column-wise of the device and the second electrode comprises a plurality of electrode strips extending row-wise of the device, pixels being defined in the device where the row-wise extending strips and the column-wise extending strips respectively overlap.

5. An electroluminescent device according to claim 4, including addressing means for applying row select voltages to the row-wise extending electrode strips and column data voltages to the column-wise extending electrode strips thereby to selectively address pixels of the display.

6. An electroluminescent device according to claim 5 wherein said addressing means is operable to apply dc voltages.

7. An electroluminescent device according to claim 1 wherein, the first electrode is associated with the electroluminescent layer;

the second electrode is associated with a photoconductive layer; and the electroluminescent device further comprises a third electrode located between the electroluminescent layer and the photoconductive layer.

8. An electroluminescent device according to claim 1 further comprising means for applying a voltage between the first and second electrodes, while the third electrode remains floating.

9. An electroluminescent device according to claim 7, wherein at least one of the electroluminescent layer and the photoconductive layer is formed of a semiconductive conjugated polymer.

10. An electroluminescent device according to claim 9 wherein the semiconductive conjugated polymer is selected from the family of polyphenylenevinylene (PPV) and its derivatives.

11. An electroluminescent device according claim 7 wherein the first electrode comprises a plurality of electrode strips extending column-wise of the device and the second electrode comprises a plurality of electrode strips extending row-wise of the device, pixels being defined in the device where the row-wise extending strips and the column-wise extending strips respectively overlap.

12. An electroluminescent device according to claim 11 which comprises addressing means for applying row select voltages to the row-wise extending electrode strips, and column data voltages to the column-wise extending electrode strips thereby to selectively address pixels of the display.

13. An electroluminescent device according to claim 12 wherein said addressing means is operable to apply dc voltages.

14. An electroluminescent device according to claim 1 further comprising means for applying a voltage between the first and second electrodes.

15. An electroluminescent device comprising:

a first electrode associated with an electroluminescent layer;

a second electrode associated with a photoconductive layer; and a third electrode located between the electroluminescent layer and the photoconductive layer; and wherein the third electrode defines with the first electrode an electroluminescent unit and wherein there is a fourth electrode which defines with the second electrode a photoconductive unit, wherein light generated by the electroluminescent unit is incident on the photoconductive layer of the photoconductive unit.

* * * * *